(12) United States Patent
Shiraiwa et al.

(10) Patent No.: US 10,299,414 B2
(45) Date of Patent: May 21, 2019

(54) COOLING MECHANISM FOR DATA CENTER

(71) Applicants: Hidetoshi Kaneo, Sunto-gun, Shizuoka (JP); INSTITUTE OF NATIONAL COLLEGES OF TECHNOLOGY, JAPAN, Hachioji-shi, Tokyo (JP)

(72) Inventors: Hiroyuki Shiraiwa, Miyakonojo (JP); Hidetoshi Kaneo, Sunto-gun (JP)

(73) Assignees: HIDETOSHI KANEO, Sunto-gun (JP); INSTITUTE OF NATIONAL COLLEGES OF TECHNOLOGY, Hachioji-shi (JP)

( * ) Notice: Subject to any disclaimer, the term of this patent is extended or adjusted under 35 U.S.C. 154(b) by 721 days.

(21) Appl. No.: 14/764,055

(22) PCT Filed: Feb. 7, 2014

(86) PCT No.: PCT/JP2014/052854
§ 371 (c)(1),
(2) Date: Jul. 28, 2015

(87) PCT Pub. No.: WO2014/126005
PCT Pub. Date: Aug. 21, 2014

(65) Prior Publication Data
US 2016/0014934 A1   Jan. 14, 2016

(30) Foreign Application Priority Data

Feb. 12, 2013 (JP) ................................. 2013-024376
Jun. 17, 2013 (JP) ................................. 2013-126770

(51) Int. Cl.
*H05K 7/20* (2006.01)
*F25B 25/00* (2006.01)

(52) U.S. Cl.
CPC ....... *H05K 7/20827* (2013.01); *F25B 25/005* (2013.01); *H05K 7/20309* (2013.01); *H05K 7/20318* (2013.01)

(58) Field of Classification Search
CPC ..... F25D 17/04; F25B 7/00; F25B 2400/0401
See application file for complete search history.

(56) References Cited

U.S. PATENT DOCUMENTS 4,865,073 A * 9/1989 Kocher ................. F25B 41/065
                                                       137/412
5,634,353 A * 6/1997 Hallin ..................... F24F 3/153
                                                        62/476

(Continued)

FOREIGN PATENT DOCUMENTS

EP     2034247 A1 * 3/2009 ............ F24F 13/222
JP     H08-219473 A     8/1996

(Continued)

OTHER PUBLICATIONS

Machine Translation of Description of EP2034247—Original Disclosure Published on Mar. 2009 (Year: 2009).*

(Continued)

*Primary Examiner* — Orlando E Aviles
(74) *Attorney, Agent, or Firm* — Oliff PLC

(57) ABSTRACT

[Problem to be Solved] A technical object is to develop a novel cooling mechanism for a data center that can be operated at low running costs, can eliminate dust penetration, water droplet occurrence, and water leakage, can reduce temperature unevenness in the indoor space, and can achieve prompt fire extinction with little damage even in the case where a fire breaks out.
[Solution] Provided is a cooling mechanism for a data center, including: an evaporative condenser and a liquid receiver arranged outside of the data center; and an evaporator arranged in an indoor space of the data center. The (Continued)

indoor space is cooled by evaporating a refrigerant in the evaporator, and the refrigerant is condensed by the evaporative condenser.

5 Claims, 7 Drawing Sheets

(56) References Cited

U.S. PATENT DOCUMENTS

| | | |
|---|---|---|
| 2006/0266058 A1 | 11/2006 | Nemoto et al. |
| 2007/0234753 A1 | 10/2007 | Nemoto et al. |
| 2008/0223074 A1* | 9/2008 | Pachai ................. F04C 23/001 62/513 |
| 2009/0095001 A1* | 4/2009 | Imai ...................... F25B 19/04 62/196.3 |
| 2009/0296346 A1* | 12/2009 | Van Andel ......... H05K 7/20609 361/696 |
| 2010/0263885 A1* | 10/2010 | Tuma ...................... A62C 3/16 169/46 |
| 2012/0247138 A1* | 10/2012 | Senf, Jr. ................. F25B 49/02 62/191 |

FOREIGN PATENT DOCUMENTS

| | | |
|---|---|---|
| JP | 2003-240360 A | 8/2003 |
| JP | 2005-030622 A | 2/2005 |
| JP | 2006-329601 A | 12/2006 |
| JP | 2007-024442 A | 2/2007 |
| JP | 2008-175522 A | 7/2008 |
| JP | 2008-209111 A | 9/2008 |
| JP | 2009-121269 A | 6/2009 |
| JP | 2011-242077 A | 12/2011 |
| JP | 2012-102946 A | 5/2012 |
| WO | 2011/145685 A1 | 11/2011 |

OTHER PUBLICATIONS

Mar. 25, 2014 International Search Report issued in International Patent Application No. PCT/JP2014/052854.

* cited by examiner

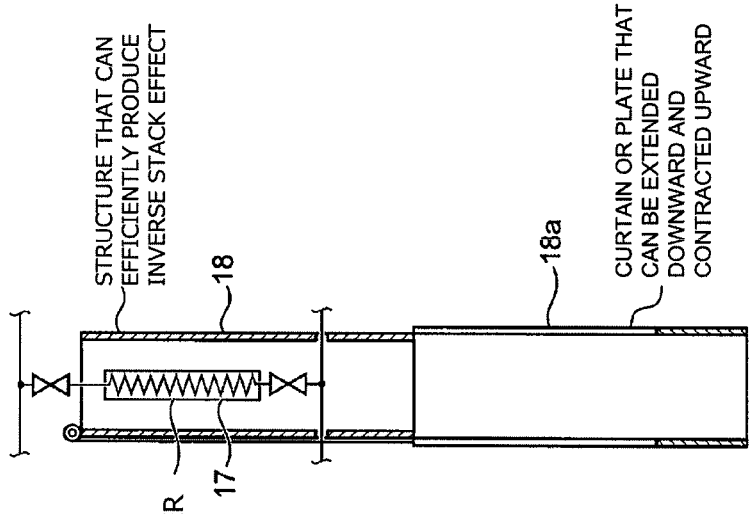
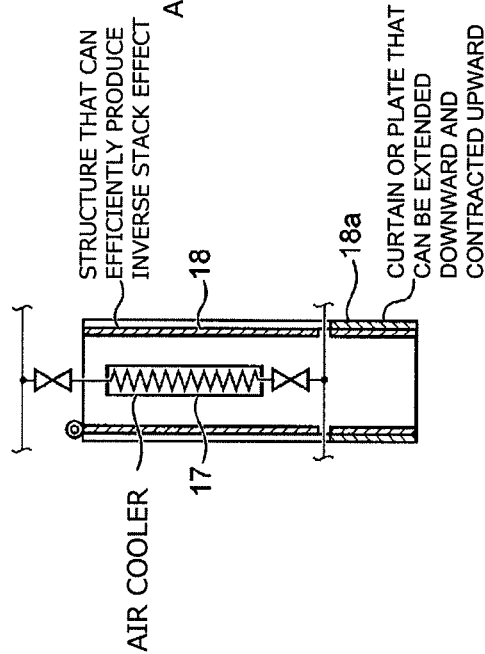
Fig.3(a)
Fig.3(b)

COOLING MECHANISM FOR DATA CENTER

TECHNICAL FIELD

The present invention relates to a cooling mechanism for a data center, and, more particularly, to a cooling mechanism for a data center that can noticeably reduce power consumption.

BACKGROUND ART

A cooling mechanism is essential to a data center in which a large number of IT machines (heat radiating machines) such as servers and network machines are installed, and the cooling mechanism serves to cool the IT machines such that the temperatures of the IT machines do not become equal to or higher than a predetermined temperature (about 27 to 30° C.), in order to stably operate the IT machines.

In the indoor space of such a data center, people stay for an extremely short time except during maintenance, and the amount of ventilation is small. Hence, the latent heat load is low. Meanwhile, the amount of heat radiated from the heat radiating machines is enormous. Hence, the sensible heat load is high, and the load exists over the entire indoor space.

Under the present circumstances, such a configuration that feeds cool air generated by a cooling apparatus into the heat radiating machines using an air blowing apparatus is the mainstream of the cooling mechanism (see, for example, Patent Literature 1).

However, the cooling mechanism according to such a method has the following and other problems: the power consumption of the air blowing apparatus is enormous due to a great amount of blown air and a long air blowing distance; a large space is necessary for the air blowing; and temperature unevenness occurs due to an attempt to uniformly cool a large space.

In addition to the above-mentioned method, there is a water cooling mechanism in which: a circulation route is formed so as to surround the heat radiating machines; and a cooling medium is circulated in the circulation route. However, in the case where liquid leakage occurs, the risk that the IT machines may be damaged cannot be completely eliminated. Hence, the water cooling mechanism cannot necessarily be considered to be suitable for the data center that is required to have stability and reliability.

As described above, under the present circumstances, in order to stably operate the data center, no cooling mechanism can sufficiently satisfy both of the following: prevention of dust penetration, water droplet occurrence, and water leakage; and a reduction in running costs such as consumed electric power.

Note that the following problem also exists. That is, if a fire breaks out in the data center due to electrical leakage or the like, water is discharged by a sprinkler or the like. Hence, not only machines near the origin of the fire but also other machines become inoperable, and a great amount of data is lost.

CITATION LIST

Patent Literature

Patent Literature 1: Japanese Patent Laid-Open No. 2011-242077

SUMMARY OF INVENTION

Technical Problem

The present invention has been made in view of the above-mentioned circumstances. As a result of comprehensively considering a situation in which: a necessary cooling temperature is relatively high and the latent heat load is low; and, meanwhile, the sensible heat load is high and the generation source thereof covers a wide range, the present invention is based on an idea of more actively making efficient use of outdoor air conditions, and has a technical object to develop a novel cooling mechanism for a data center that can be operated at low running costs, can eliminate dust penetration, water droplet occurrence, and water leakage, can reduce temperature unevenness in the indoor space, and can achieve prompt fire extinction with little damage even in the case where a fire breaks out.

Solution to Problem

That is, a cooling mechanism for a data center includes: an evaporative condenser and a liquid receiver arranged outside of the data center; and an evaporator arranged in an indoor space of the data center. The indoor space is cooled by evaporating a refrigerant in the evaporator, and the refrigerant is condensed by the evaporative condenser.

Further, in addition to the above-mentioned requirement, in the cooling mechanism for the data center, a first cooling cycle including the evaporative condenser, the liquid receiver, and the evaporator, and a second cooling cycle including a compressor, a condenser, and an evaporator are arranged in parallel with each other.

Furthermore, a cooling mechanism for the data center includes: a first cooling cycle including, outside of the data center, a variable-speed turbo compressor, the evaporative condenser, a high-pressure liquid receiver, a liquid level controlling mechanism, a low-pressure liquid receiver, and a cascade condenser; and a second cooling cycle formed as a loop circuit, the evaporator arranged in the indoor space of the data center being connected to a liquid receiver and a liquid pump by pipe lines in the loop circuit; and carbon dioxide as a secondary refrigerant being condensed by the cascade condenser downstream of the evaporator. When a condensation temperature of the evaporative condenser is equal to or lower than a predetermined temperature, the primary cooling cycle circulates a primary refrigerant without causing the compressor to function, and the indoor space is cooled by the secondary refrigerant that is condensed by the cascade condenser in the secondary cooling cycle.

Furthermore, a cooling mechanism for the data center includes: a first cooling cycle including, outside of the data center, a reciprocating compressor, the evaporative condenser, a high-pressure liquid receiver, a liquid level controlling mechanism, a low-pressure liquid receiver, and a cascade condenser, and the first cooling cycle further including a bypass pipe line for bypassing the compressor; and a second cooling cycle formed as a loop circuit, the evaporator arranged in the indoor space of the data center being connected to a liquid receiver and a liquid pump by pipe lines in the loop circuit; and carbon dioxide as a secondary refrigerant being condensed by the cascade condenser downstream of the evaporator. When a condensation temperature of the evaporative condenser is equal to or lower than a predetermined temperature, the primary cooling cycle stops the compressor, and opens the bypass pipe line for bypassing the compressor, to thereby circulate a primary refrigerant without causing the compressor to function, and the indoor space is cooled by the secondary refrigerant that is condensed by the cascade condenser in the secondary cooling cycle.

Furthermore, in a cooling mechanism for the data center, an evaporative condenser is connected to the liquid receiver in the secondary cooling cycle.

Furthermore, in a cooling mechanism for the data center, the cascade condenser in the secondary cooling cycle is built in the liquid receiver.

Furthermore, in a cooling mechanism for the data center, the refrigerant can be blown off in the indoor space.

Furthermore, in a cooling mechanism for the data center, the evaporator is surrounded by an upright partition wall that produces an inverse stack effect, and the cooling mechanism has a structure in which, when air in the vicinity of the evaporator is cooled, high-temperature air existing in an upper part of the indoor space of the data center is efficiently drawn toward the evaporator without using a fan, the high-temperature air is cooled, and then the cooled air is discharged downward.

Furthermore, in a cooling mechanism for the data center, a lower part of the partition wall is provided with an extension/contraction part.

Advantageous Effects of Invention

First, the refrigerant is condensed at a sufficiently low temperature by the evaporative condenser over a long period of the year. Hence, the cooling mechanism can be operated at low costs with suppressed power consumption, and initial costs can be reduced.

Further, an operation by only the first cooling cycle is performed in a normal state, and the second cooling cycle including the compressor is caused to work when the cooling cannot be covered by only the first cooling cycle, whereby an increase in temperature in the indoor space can be reliably prevented. Further, the first cooling cycle is caused to work at the same time as the second cooling cycle, whereby a load on the compressor can be reduced, thus achieving a reduction in power consumption.

Further, in the case where the condensation temperature of the evaporative condenser is lower than the predetermined temperature, an operation of circulating the refrigerant without causing the variable-speed turbo compressor to function is performed, whereby heat release from the refrigerant and condensation of the refrigerant are sufficiently performed in the condenser with no power consumption by the variable-speed turbo compressor. As a result, running costs can be noticeably reduced.

Further, in the case where the condensation temperature of the evaporative condenser is higher than the predetermined temperature, an efficient operation is possible by controlling the variable-speed turbo compressor such that the temperature of the indoor space becomes a predetermined temperature. Moreover, the condensation temperature of the evaporative condenser can be made lower by about 5.degree. C. and 10.degree. C. than those of a shell-and-tube condenser that uses cooling water cooled by a cooling tower and an air-cooled condenser, respectively. This fact leads to not only a reduction in electric power consumed by the refrigerator but also shortening of the working period of the refrigerator, and thus is an extremely important element for energy saving.

Further, even if the operation of the variable-speed turbo compressor is stopped, the refrigerant gas can freely pass through the compressor, and hence other control concerning activation or stop of the compressor depending on the condensation temperature can be simplified.

Further, heat in the indoor space of the data center is effectively released to the outside by the refrigerant in the pipe lines without introducing outdoor air. Hence, dust penetration and water droplet occurrence in the indoor space can be effectively prevented.

Further, carbon dioxide that can be inexpensively and stably obtained, has high heat transportation performance, and is nature-friendly is used as the secondary refrigerant in the secondary cooling cycle including the cascade condenser and the subsequent members, whereby an efficient cooling mechanism can be achieved with reduced equipment costs.

Further, even in the case of adopting the compressor of reciprocating type, an operation of circulating the refrigerant without causing the compressor to function can be performed.

Further, carbon dioxide that can be inexpensively and stably obtained, has high heat transportation performance, and is nature-friendly is used as the secondary refrigerant in the secondary cooling cycle including the cascade condenser and the subsequent members, whereby an efficient cooling mechanism can be achieved with reduced equipment costs.

Furthermore, an operation of condensing the refrigerant by only the evaporative condenser connected to the liquid receiver in the secondary cooling cycle while stopping the primary cooling cycle is performed in a normal state, and the primary cooling cycle including the compressor is caused to work when the cooling cannot be covered by only this evaporative condenser, whereby an increase in temperature in the indoor space can be reliably prevented. Further, this evaporative condenser is caused to work at the same time as the primary cooling cycle, whereby a load on the compressor can be reduced, thus achieving a reduction in power consumption.

Furthermore, the evaporative condenser is built in the liquid receiver. Accordingly, in the case where carbon dioxide is used as the secondary refrigerant, even if the pressure resistance of a plate cooler that is a constituent element of the cascade condenser is low, the secondary refrigerant is condensed in the hermetically sealed liquid receiver. Hence, the apparent pressure difference is small, and the secondary refrigerant can be safely and stably condensed.

Furthermore, in the case where a fire breaks out, once evacuation of staffs in the data center is ended and it is confirmed that the data center is empty, prompt fire extinction can be achieved by blowing off carbon dioxide in the indoor space, and damage to other machines than the machine in which the fire breaks out can be avoided.

Further, efficiently generated is a circulation flow in which, when the air in the vicinity of the evaporator is cooled, the warm air existing in the upper part is suctioned into the partition wall and is discharged downward as cool air with the utilization of the inverse stack effect, so that performance of the evaporator can be delivered without an air blowing machine such as a fan and a blower. If such an evaporator is arranged in the vicinity of an area above electronic machines and the like that are heat load generation sources, the inside of the large data center can be relatively evenly cooled without an air blowing machine such as a fan and a blower, while power consumption is reduced.

Furthermore, the extension/contraction part is provided. Accordingly, a lower end part of the partition wall can be extended to a lower position, and the inverse stack effect can be further enhanced.

BRIEF DESCRIPTION OF DRAWINGS

FIG. 3 are schematic diagrams respectively illustrating a contracted state and an extended state of an extension/contraction part provided to a partition wall.

DESCRIPTION OF EMBODIMENTS

Figure 1:
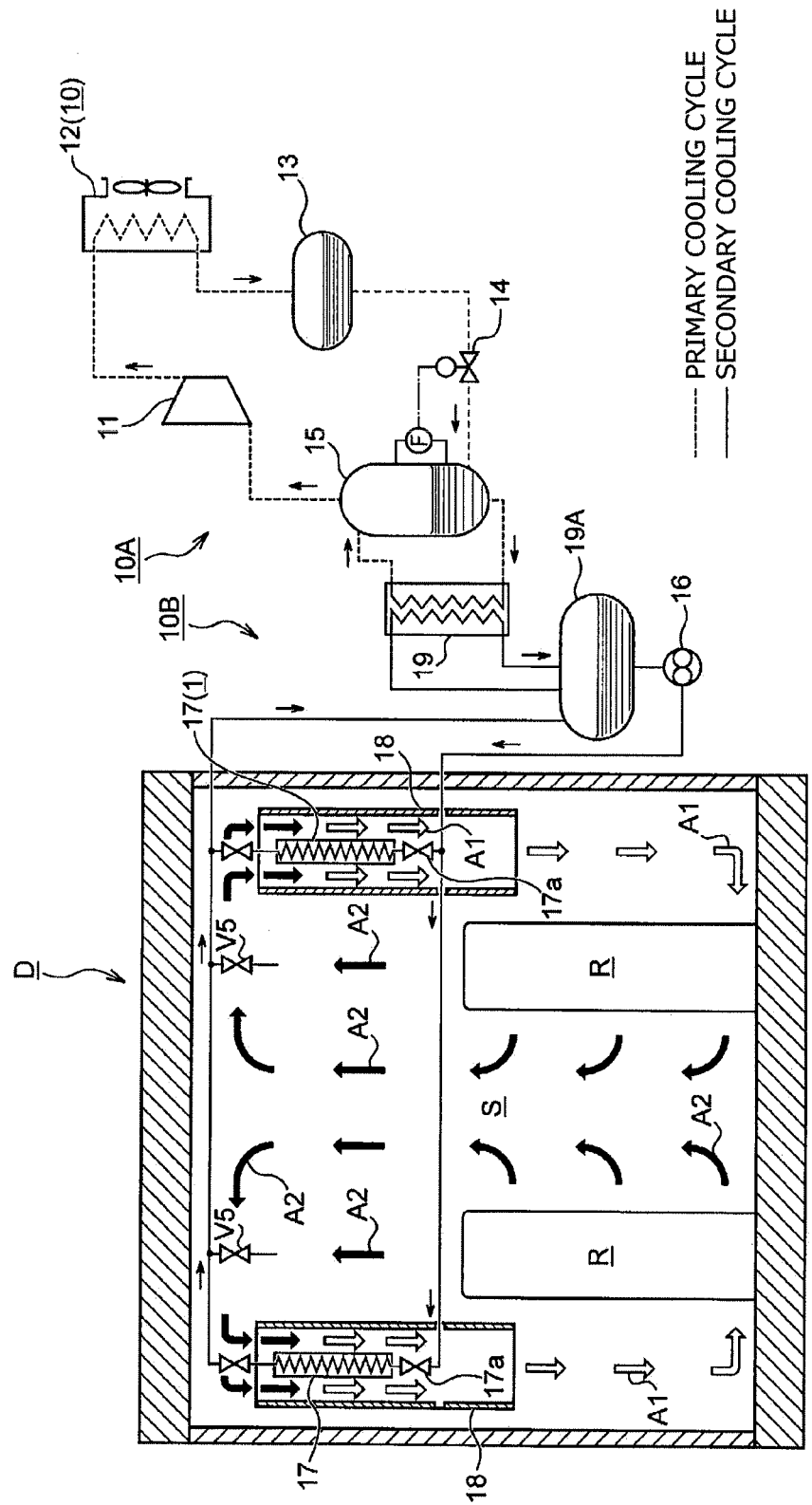
FIG. 1 is a schematic diagram illustrating a cooling mechanism for a data center, including a variable-speed turbo compressor.

The following embodiments of a cooling mechanism for a data center of the present invention are some of the best modes thereof, and the present invention also includes modes modified on the basis of this technical idea.

Embodiments

First, a data center D that is an application target of the present invention is a facility in which a large number of IT machines such as servers and network machines are installed while being housed in appropriate racks. Note that the IT machines are hereinafter referred to as the heat radiating machines R, focusing on their heat radiating characteristics.

A cooling mechanism 1 for the data center D of the present invention (hereinafter, simply referred to as the cooling mechanism 1) includes: an evaporative condenser 12 and a liquid receiver arranged outside of the data center D; and evaporators 17 arranged in an indoor space S of the data center D. The indoor space S (heat radiating machines R) is cooled by cool air A1 generated by evaporating a refrigerant in the evaporators 17, and the refrigerant is condensed by the evaporative condenser 12.

Then, in the case where the condensation temperature of the evaporative condenser 12 is higher than a predetermined temperature, the cooling mechanism 1 described below in basic embodiments (FIGS. 1 and 2) performs an operation of circulating the refrigerant while causing the compressor 11 to function. Meanwhile, in the case where the condensation temperature thereof is lower than the predetermined temperature, the cooling mechanism 1 can perform an operation of circulating the refrigerant without causing the compressor 11 to function.

Hereinafter, description is given for each embodiment in which the cooling mechanism 1 has a different configuration.

(Embodiment in which the Compressor is of Variable-Speed Turbo Type)

First, description is given of the embodiment illustrated in FIG. 1. In the cooling mechanism 1 described in this embodiment, the refrigerant flow path in a heat pump unit 10 is defined as a primary cooling cycle 10A and a secondary cooling cycle 10B, the refrigerants respectively circulating in these cycles exchange heat in a cascade condenser 19, and the cooled and liquefied secondary refrigerant passes through each evaporator 17, so that the cool air A1 is generated. Then, the compressor 11 provided between a low-pressure liquid receiver 15 to be described later and the evaporative condenser 12 is of variable-speed turbo type.

The primary cooling cycle 10A is formed as a loop circuit in which the compressor 11, the evaporative condenser 12 as a condenser, a high-pressure liquid receiver 13, a liquid level controlling mechanism 14, the low-pressure liquid receiver 15, and the cascade condenser 19 are connected by reciprocating pipe lines so as to enable circulation of the refrigerant, and the refrigerant in the primary cooling cycle 10A is chlorofluorocarbons, ammonia, carbon dioxide, or the like. Note that, although the high-pressure liquid receiver 13 functions as a buffer for the refrigerant, the evaporative condenser 12 and the liquid level controlling mechanism 14 may be directly connected by a pipe line, and the pipe line may be caused to substantially function as the high-pressure liquid receiver 13.

Further, the secondary cooling cycle 10B is formed as a loop circuit in which the cascade condenser 19, a liquid receiver 19A, a liquid pump 16, flow rate adjusting valves 17a, and the evaporators 17 are connected by reciprocating pipe lines so as to enable circulation of the refrigerant, and the refrigerant in the secondary cooling cycle 10B is carbon dioxide.

Then, the heat radiating machines R are installed in the indoor space S of the data center D, and, in this embodiment, as an example, the evaporators 17 are installed in an upper part of the indoor space S. Note that the installation place of the evaporators 17 is not limited to the upper part of the indoor space S, and the evaporators 17 may be installed in an appropriate place in accordance with modes of the heat radiating machines R and the indoor space S.

Further, the primary cooling cycle 10A and the secondary cooling cycle 10B configured as described above are controlled by an appropriate control apparatus. As an example, the pressure of the secondary refrigerant near the cascade condenser 19 is detected by an appropriate sensor, and the operation states and the like of the compressor 11, the fan of the evaporative condenser 12 and the like are controlled in accordance with the detected value, in order to perform intended control. Moreover, the temperature of the secondary refrigerant is detected, and the operation states and the like of the compressor 11, the fan of the evaporative condenser 12 and the like are controlled in accordance with the detected value, in order to perform intended control.

Further, a partition wall 18 is provided so as to surround each evaporator 17. The partition wall 18 is a member for producing, in the indoor space S, natural circulation (inverse stack effect) in which: the cool air A1 generated by the evaporator 17 is fed downward from a lower opening part of the partition wall 18; and warm air A2 generated by the heat radiating machines R is taken in from an upper opening part of the partition wall 18 and is guided toward the evaporator 17. Note that, although illustration is omitted, a plurality of the evaporators 17 may be arranged in one partition wall 18.

Further, in this embodiment, the heat radiating machines R are the IT machines housed in the appropriate racks. Considering that each IT machine is provided with a fan, for example, as illustrated in FIG. 1, the air discharging directions of the opposed heat radiating machines R are opposed to each other, and the evaporators 17 and the partition walls 18 are provided only above the air suctioning side surfaces of the heat radiating machines R.

Further, a lower part of the partition wall 18 is provided with such an extension/contraction part 18a as illustrated in FIG. 3. The degree of extension of the extension/contraction part 18a is adjusted, whereby the substantial route length of the downward feeding of the cool air A1 in the partition wall 18 can be adjusted. Hence, if the lower end of the extension/contraction part 18a is extended to a position lower than the highest part of the heat radiating machine R, the inverse stack effect can be enhanced, and the cool air A1 can reliably reach the floor surface. Note that an appropriate mode is adopted for the extension/contraction part 18a. For example, the extension/contraction part 18a may be formed in a curtain-like manner using a cloth-like member, and may be formed using a plate-like member.

The cooling mechanism 1 of the present invention described in this embodiment has such a configuration as described above, and operates in the following manner to cool the indoor space S of the data center D and the heat radiating machines R. Note that temperature conditions in the following description are given as mere examples, and the temperature conditions can vary in accordance with the allowable temperatures of the heat radiating machines R and the like.

(1) In the Case where the Condensation Temperature of the Evaporative Condenser is Higher than a Predetermined Temperature First, in the case where the condensation temperature thereof is higher than the predetermined temperature (as an example, when the temperature of the warm air A2 is 30° C. and the cool air A1 at 25° C. is generated, in the case where the condensation temperature thereof is equal to or higher than 20° C.), the operation of circulating the refrigerant while causing the compressor 11 to function is performed.

Then, if the compressor 11 is activated, the refrigerant (20° C. or lower) evaporated in the cascade condenser 19 enters the evaporative condenser 12 in a compressed state to be condensed and liquefied (20° C. or higher), and flows down to the high-pressure liquid receiver 13. The refrigerant liquid stored in the high-pressure liquid receiver 13 is supplied as appropriate from the high-pressure liquid receiver 13 to the low-pressure liquid receiver 15 such that the liquid level in the low-pressure liquid receiver 15 is kept constant by the liquid level controlling mechanism 14. The low-pressure liquid receiver 15 also serves as a liquid separator, and sends the refrigerant gas in a gaseous state to the compressor 11, to thereby lower the temperature of the refrigerant liquid sent to the cascade condenser 19 up to a temperature (20° C. or lower) close to the evaporation temperature. The refrigerant liquid stored in the low-pressure liquid receiver 15 is sent to the cascade condenser 19 to be evaporated, and returns in a gas-liquid mixed phase state to the low-pressure liquid receiver 15. Then, only the refrigerant in a gaseous state is returned to the compressor 11.

Meanwhile, the secondary refrigerant cooled by the cascade condenser 19 is condensed and liquefied, flows down to the liquid receiver 19A, is suctioned and discharged by the liquid pump 16, and reaches the evaporators 17. Part of the secondary refrigerant is evaporated, and returns in a gas-liquid mixed state to the liquid receiver 19A. Then, only the gaseous gas is suctioned by the cascade condenser 19, is cooled to be condensed and liquefied, and returns to the liquid receiver 19A again.

Each evaporator 17 cools surrounding air to generate the cool air A1, generates a natural circulation flow that carries the cool air A1 downward due to the inverse stack effect, and suctions the high-temperature warm air A2 existing in an upper space of the indoor space S.

In this way, in the case where the condensation temperature of the evaporative condenser 12 is higher than the predetermined temperature, the variable-speed turbo compressor 11 is operated, whereby the temperature (substantially equal to the evaporation temperature) of the low-pressure liquid receiver 15 is made equal to or lower than 20° C. At this time, the difference between the temperature of the liquid receiver 19A and the temperature of the low-pressure liquid receiver 15 is controlled to be extremely small.

Meanwhile, the cool air A1 generated by each evaporator 17 is fed downward in each partition wall 18, and is eventually discharged from the opening part at the lower end of the partition wall 18 (extension/contraction part 18a) toward the floor surface of the indoor space S. At this time, if the lower end of the partition wall 18 (extension/contraction part 18a) is extended to a position lower than the highest part of the heat radiating machines R, collision between the warm air A2 and the cool air A1 can be minimized, and the cool air A1 can reliably reach the floor surface. Moreover, in the drawing, a lower outer peripheral part of the partition wall 18 is not in contact with the heat radiating machines R, and hence a space exists in this portion. Alternatively, if the outer peripheral part of the partition wall 18 is in contact with the heat radiating machines R, such a problem that the warm air A2 is drawn downward from this space can be avoided.

Then, the cool air A1 absorbs heat radiated from the heat radiating machines R to become the warm air A2, and flows upward in the indoor space S. On this occasion, the space in which the partition walls 18 are opposed to each other forms the upward flow route of the warm air A2, and hence the warm air A2 can smoothly reach the vicinity of the ceiling without being hindered by the cool air A1 and the atmosphere in the indoor space S.

Subsequently, the warm air A2 located in the vicinity of the ceiling is suctioned from the upper opening part of each partition wall 18 along with the downward feeding of the cool air A1 in the partition wall 18, and eventually comes into contact with each evaporator 17 to become the cool air A1. In this way, the warm air A2 in the highest temperature state located in the vicinity of the ceiling is introduced into the partition wall 18, and hence a cooling effect produced by the cooling mechanism 1 can be maximized.

As described above, without the need for an air blowing machine such as a fan and a blower, the cooling mechanism 1 of the present invention can produce, in the indoor space S, the natural circulation (inverse stack effect) in which: the warm air A2 is taken in from the upper opening part of each partition wall 18 to be guided toward each evaporator 17; and the cool air A1 is fed downward. Hence, a machine for air blowing and circulation is not necessary, and a significant reduction in power consumption can be achieved. Moreover, heat in the indoor space S of the data center D is effectively released to the outside by the heat pump unit 10 without introducing outdoor air. Hence, dust penetration and water droplet occurrence in the indoor space S can be effectively prevented. Then, an efficient operation is possible by controlling the variable-speed turbo compressor 11 such that the temperature of the indoor space S becomes a predetermined temperature.

(2) In the Case where the Condensation Temperature of the Evaporative Condenser is Lower than the Predetermined Temperature Next, in the case where the condensation temperature of the evaporative condenser 12 is lower than the predetermined temperature (as an example, when the temperature of the warm air A2 is 30° C. and the cool air A1 at 25° C. is generated, in the case where the condensation temperature of the evaporative condenser 12 is lower than 20° C.), the operation of circulating the refrigerant without causing the variable-speed turbo compressor 11 to function is performed.

That is, in this case, the variable-speed turbo compressor 11 whose power is stopped does not function as a compressor, but functions as a mere refrigerant flow path. Moreover, because the compressor 11 does not function, the pressure of the refrigerant does not become high, and the liquid level controlling mechanism 14 substantially acts to set the liquid head difference between the high-pressure liquid receiver 13 and the low-pressure liquid receiver 15. Consequently, the liquid level controlling mechanism 14 sets a flow rate suited to the liquid head difference, and functions as, so to speak, a flow rate adjusting valve.

Then, the refrigerant in a gaseous state that has passed through the compressor 11 from the cascade condenser 19 releases heat in the evaporative condenser 12, is condensed (lower than 20° C.) to become a liquid phase state, and flows down to the high-pressure liquid receiver 13. Subsequently, the refrigerant in the liquid phase state passes through the liquid level controlling mechanism 14 to be sent to the low-pressure liquid receiver 15, and is sent to the cascade condenser 19 under pressure by natural circulation. Part of the refrigerant is evaporated, and returns to the low-pressure liquid receiver 15 again. After gas liquid separation, only the refrigerant gas in a gaseous state returns to the evaporative condenser 12.

Meanwhile, the secondary refrigerant cooled by the cascade condenser 19 is condensed and liquefied, flows down to the liquid receiver 19A, is suctioned and discharged by the liquid pump 16, and reaches the evaporators 17. Part of the secondary refrigerant is evaporated, and returns in a gas-liquid mixed state to the liquid receiver 19A. Then, only the gaseous gas is suctioned by the cascade condenser 19, is cooled to be condensed and liquefied, and returns to the liquid receiver 19A again.

Then, as described above, the air (cool air A1) cooled by each evaporator 17 naturally circulates in the indoor space S due to the inverse stack effect, and fulfills intended cooling.

Incidentally, also for areas south of Tokyo in Japan, in the case where the cool air A1 at 25° C. is generated, such an operation in which the variable-speed turbo compressor 11 is not caused to function can be performed in other seasons than the summer, and the period during which it is necessary to perform the above-mentioned operation in which the compressor 11 is caused to function is about 90 days a year.

Note that production of the natural circulation by each partition wall 18 is similar to that in the above-mentioned operation in which the compressor 11 is caused to function, and hence description thereof is omitted here.

(Embodiment in which the Compressor is of Reciprocating Type and a Bypass Route is Provided)

Figure 2:
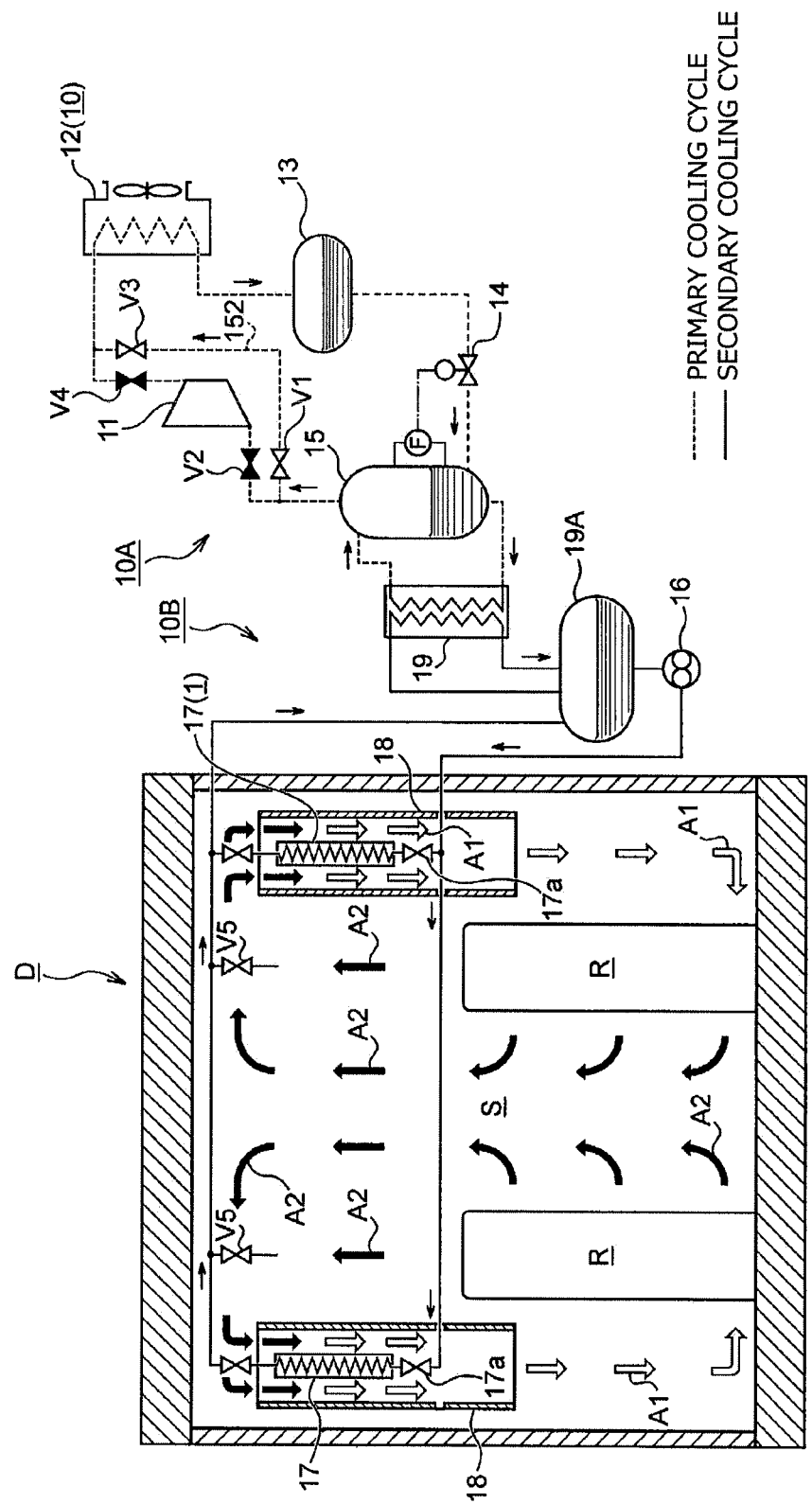
FIG. 2 is a schematic diagram illustrating a cooling mechanism provided with a bypass route.

Next, the cooling mechanism 1 described in this embodiment is illustrated in FIG. 2. The compressor 11 is provided between the low-pressure liquid receiver 15 and the evaporative condenser 12 is of reciprocating type.

Then, switching between the operation of circulating the refrigerant while causing the compressor 11 to function and the operation of circulating the refrigerant without causing the compressor 11 to function is made using a bypass pipe line 152 for the refrigerant.

Note that the cooling mechanism 1 illustrated in FIG. 2 have the same basic configuration as that of the cooling mechanism 1 illustrated in FIG. 1, and hence only portions having different configurations are described here.

Specifically, the bypass pipe line 152 that enables the refrigerant to circulate while avoiding the reciprocating compressor 11 is provided, and valves V1 to V4 for selecting a refrigerant flow path are provided (only the valves V1 and V2 may be provided).

The cooling mechanism 1 of the present invention described in this embodiment has such a configuration as described above, and operates in the following manner to cool the indoor space S of the data center D and the heat radiating machines R.

(1) In the Case where the Condensation Temperature of the Evaporative Condenser is Higher than a Predetermined Temperature First, in the case where the condensation temperature of the evaporative condenser 12 is higher than the predetermined temperature (as an example, when the temperature of the warm air A2 is 30° C. and the cool air A1 at 25° C. is generated, in the case where the condensation temperature of the evaporative condenser is equal to or higher than 20° C.), the operation of circulating the refrigerant while causing the compressor 11 to function is performed.

Specifically, the valves V1 and V3 are closed, and the valves V2 and V4 are opened, whereby the flow path in which the refrigerant passes through the compressor 11 is selected.

Then, if the compressor 11 is activated, the refrigerant in a gaseous state (pressure equivalent saturation temperature (20° C. or lower)) suctioned by the compressor 11 is compressed and then condensed. That is, the refrigerant releases heat in the evaporative condenser 12 to be condensed and liquefied. After that, the refrigerant flows down to the high-pressure liquid receiver 13, passes through the liquid level controlling mechanism 14, and flows into the low-pressure liquid receiver 15. The pressure of the low-pressure liquid receiver 15 is substantially the same as the suction pressure of the compressor 11, and is also substantially the same as the evaporation pressure (20° C. equivalent saturation pressure). The refrigerant liquid stored in the low-pressure liquid receiver 15 is sent to the cascade condenser 19. Part of the refrigerant is evaporated, and then returns to the low-pressure liquid receiver 15. After gas liquid separation, only the gas returns to the compressor 11. Note that functions and the like of the secondary cooling cycle 10B and the evaporators 17 are the same as those in the above-mentioned embodiment, and hence description thereof is omitted here.

(2) In the Case where the Condensation Temperature of the Evaporative Condenser is Lower than the Predetermined Temperature Next, in the case where the condensation temperature of the evaporative condenser 12 is lower than the predetermined temperature (as an example, when the temperature of the warm air A2 is 30° C. and the cool air A1 at 25° C. is generated, in the case where the condensation temperature of the evaporative condenser 12 is lower than 20° C.), the operation of circulating the refrigerant without causing the compressor 11 to function is performed.

Specifically, the compressor 11 is stopped, the valves V1 and V3 are opened, and the valves V2 and V4 are closed, whereby the flow path in which the refrigerant does not pass through the compressor 11 is selected.

Then, the refrigerant in a gaseous state that has passed through the bypass pipe line 152 from the cascade condenser 19 releases heat in the evaporative condenser 12, is condensed and liquefied, and flows down to the high-pressure liquid receiver 13. The refrigerant liquid stored in the high-pressure liquid receiver 13 passes through the liquid level controlling mechanism 14 to enter the low-pressure liquid receiver 15, and reaches the cascade condenser 19. Part of the refrigerant is evaporated, and returns in a gas-liquid mixed state to the low-pressure liquid receiver 15. Then, only the refrigerant gas in a gaseous state returns to the evaporative condenser 12.

Note that functions and the like of the secondary cooling cycle 10B and the evaporators 17 are the same as those in the above-mentioned embodiment, and hence description thereof is omitted here.

In this way, in the case where the condensation temperature of the evaporative condenser 12 is lower than the predetermined temperature, the refrigerant is condensed at 20° C. or lower in the evaporative condenser 12 without causing the compressor 11 to function, and hence the indoor space S of the data center D can be cooled Without operating the compressor 11.

Note that, in the above-mentioned two embodiments, carbon dioxide is used as the refrigerant in the secondary cooling cycle 10B, and carbon dioxide has a low boiling point and can be used under a high pressure. Hence, the diameters of the pipe lines of the heat pump unit 10 can be made smaller, initial costs can be reduced, and piping arrangement can be facilitated.

Further, because carbon dioxide is used as the refrigerant, if a blowoff valve V5 is provided to each pipe line portion located in the indoor space S of the data center D, in the case where a fire breaks out, prompt fire extinction can be achieved by filling the indoor space S with carbon dioxide, and damage to other machines than the machine in which the fire breaks out can be avoided.

Considering such fire extinction, two systems of the heat pump units 10 are provided, one of the heat pump units 10 is used for the fire extinction, and then the other of the heat pump units 10 takes over the cooling of the heat radiating machines R. In this manner, a function stopped state of the data center D can be minimized.

Then, the cooling mechanism 1 described in this embodiment can achieve an operation with high COP. Moreover, because the compressor 11 is not used for the secondary cooling cycle 10B, a decrease in performance of the evaporators 17 due to mixing-in of oil and the like can be avoided. Further, there is no danger of contamination by refrigerant oil, at the time of using the fire extinction function.

Note that, in the above-mentioned two types of embodiments and Claims, the adoption of the evaporative condenser 12 as a condenser is clarified. However, from the perspective of a fundamental technical idea, other condensers than the evaporative condenser 12, such as a shell-and-tube condenser that uses water cooled by a cooling tower and an air-cooled condenser, can also be used depending on outdoor air conditions. In this case, the condensation temperature is higher even under the same outdoor air temperature condition, and hence the period during which the indoor space S of the data center D can be cooled to a proper temperature without using the compressor 11 is shorter than that in the case of adopting the evaporative condenser 12. However, the cooling mechanism 1 using these condensers may be advantageous in the case of cold areas such as Hokkaido.

Other Embodiments

The above-mentioned two types of embodiments are basic embodiments of the present invention, but the following embodiments can also be adopted on the basis of the technical idea of the present invention. Note that description of the blowoff valve V5 is omitted in the following embodiments, but the blowoff valve V5 may be provided similarly to the basic embodiments.

First, in the case of countries located at high latitudes or cold areas such as Hokkaido in Japan, the data center D can be cooled by only the action of the evaporative condenser 12 without using the compressor 11 throughout the year, and a configuration specialized in such an operation can be adopted.

Figure 4:
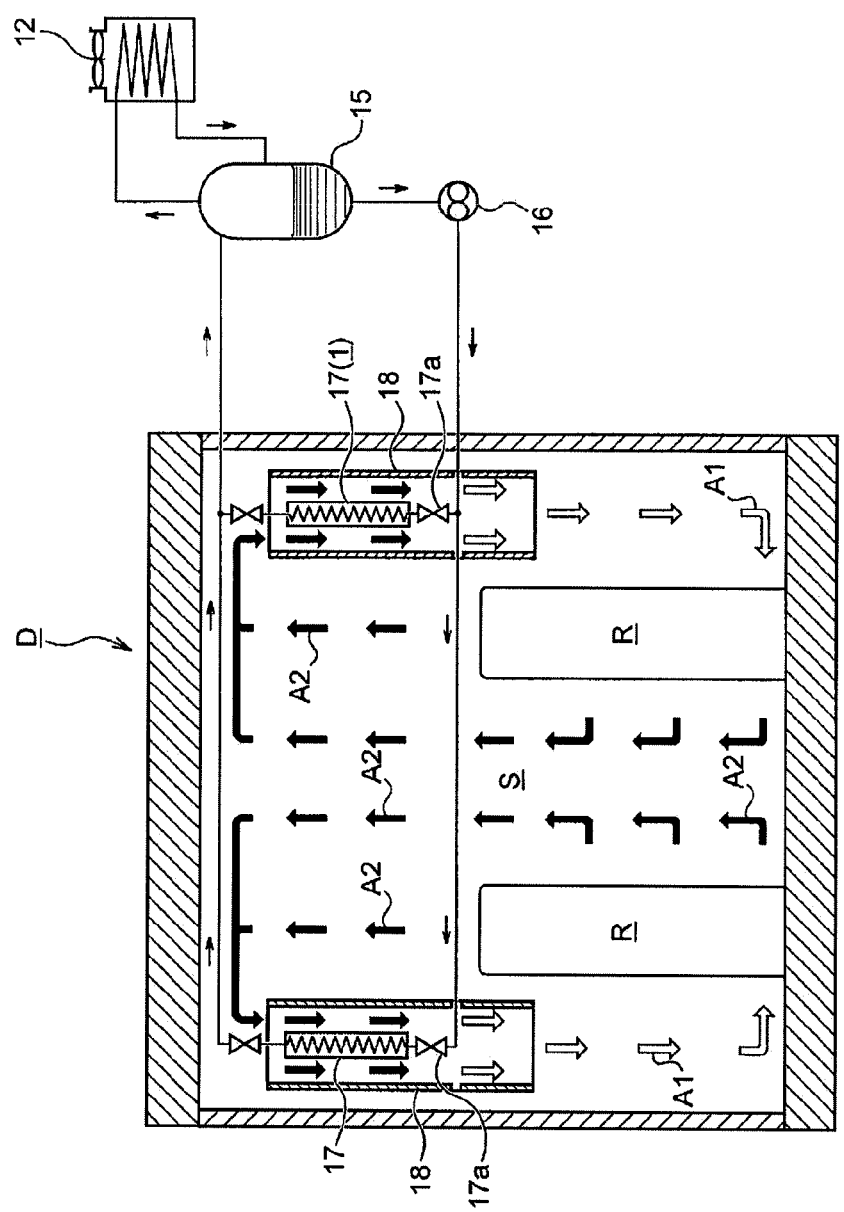
FIG. 4 is a schematic diagram illustrating a cooling mechanism configured to cool the data center by means of only an evaporative condenser.

Specifically, the following configuration can be adopted as illustrated in FIG. 4. That is, the cooling mechanism 1 includes: the evaporative condenser 12 and the low-pressure liquid receiver 15 arranged outside of the data center D; and the evaporators 17 arranged in the indoor space S of the data center D. The indoor space S is cooled by the cool air A1 generated by evaporating the refrigerant in the evaporators 17, and the refrigerant is condensed by the evaporative condenser 12. Note that supply of the refrigerant from the low-pressure liquid receiver 15 to the evaporators 17 is performed by the liquid pump 16.

Then, in the case of adopting such a configuration, the refrigerant is condensed by the evaporative condenser 12 throughout the year. Hence, the cooling mechanism 1 can be operated at low costs with suppressed power consumption, and initial costs can be reduced.

Note that there is a concern that the data center D may unexpectedly become a high-temperature state since, for example, the highest temperature may be updated in various areas due to influences of global warming and the like in recent years, and therefore such a configuration of the cooling mechanism 1 that can guarantee a stable operation of the data center D can also be adopted in the case of adopting the configuration illustrated in FIG. 4.

Figure 5:
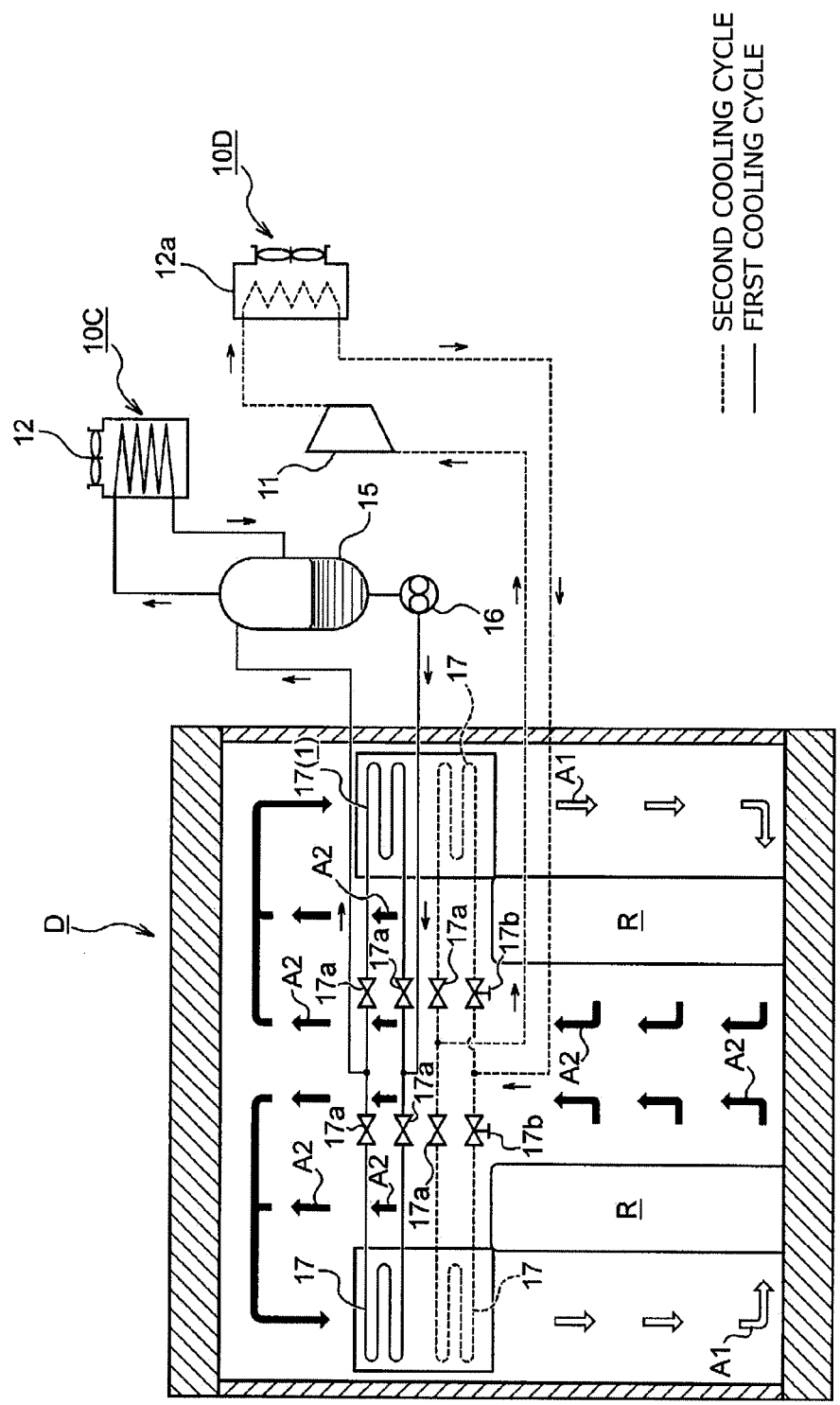
FIG. 5 is a schematic diagram illustrating a cooling mechanism including a first cooling cycle and a second cooling cycle arranged in parallel with each other.

Specifically, the following configuration can be adopted as illustrated in FIG. 5. That is, a first cooling cycle 10C including the evaporative condenser 12, the low-pressure liquid receiver 15, and the evaporators 17 as illustrated in FIG. 4 and a second cooling cycle 10D including the compressor 11, a condenser 12a (evaporative), and the evaporators 17 are arranged in parallel with each other. Note that an expansion valve 17b is provided to a portion closer to each evaporator 17 in a pipe line that connects the condenser 12a and the evaporator 17 in the second cooling cycle 10D.

Then, in the case of adopting such a configuration, an operation by only the first cooling cycle 10O is performed in a normal state, and the second cooling cycle 10D including the compressor 11 is caused to work when the cooling cannot be covered by only the first cooling cycle 10O, whereby an increase in temperature in the indoor space S can be reliably prevented. Further, the first cooling cycle 10O is caused to work at the same time as the second cooling cycle 10D, whereby a load on the compressor 11 can be reduced, thus achieving a reduction in power consumption.

Note that, although the partition wall 18 is not adopted in the cooling mechanism 1 illustrated in FIG. 5, an upper part on the evaporator 17 side of each heat radiating machine R is closed by a casing of each evaporator 17, and the following natural circulation is produced. That is, the warm air A2 that has contacted a heat dissipation part of the evaporator 17 is cooled to become the cool air A1. The cool air A1 is fed downward along lateral to the heat radiating machine R, and is used to cool the heat radiating machine R, to become the warm air A2. The resultant warm air A2 is guided to the evaporator 17 again.

Figure 6:
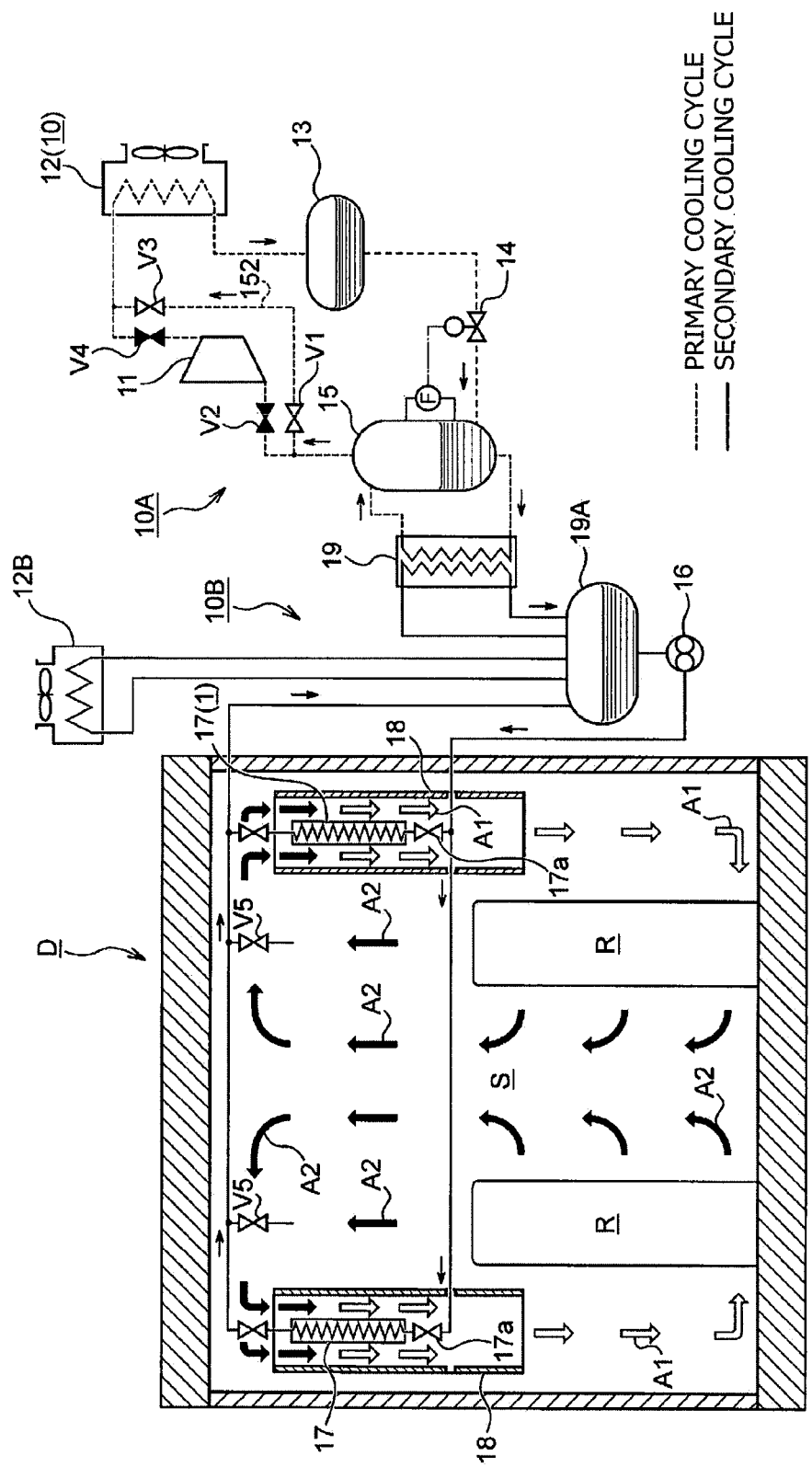
FIG. 6 is a schematic diagram illustrating a cooling mechanism in which a refrigerant in a secondary cooling cycle can be condensed by an evaporative condenser.

Furthermore, a configuration obtained by partially modifying the above-mentioned two types of basic embodiments (FIGS. 1 and 2) can also be adopted. Specifically, a configuration in which an evaporative condenser 12B is connected to a liquid receiver 19B in the secondary cooling cycle 10B can also be adopted as illustrated in FIG. 6. Note that it is assumed in FIG. 6 that, the used compressor 11 is of reciprocating type, but the bypass pipe line 152 can be omitted similarly to FIG. 1 in the case of using the variable-speed turbo compressor 11.

Then, in the case of adopting such a configuration, the secondary refrigerant in the liquid receiver 19A can be condensed by any one or both of the primary cooling cycle 10A and the evaporative condenser 12B.

Further, in the case of adopting such a configuration, an operation of condensing the secondary refrigerant by only the evaporative condenser 12B while stopping the primary cooling cycle 10A is performed in a normal state, and the primary cooling cycle 10A including the compressor 11 is caused to work when the cooling cannot be covered by only the evaporative condenser 12B, whereby an increase in temperature in the indoor space S can be reliably prevented. Further, the evaporative condenser 12B is caused to work at the same time as the primary cooling cycle 10A, whereby a load on the compressor 11 can be reduced, thus achieving a reduction in power consumption.

Figure 7:
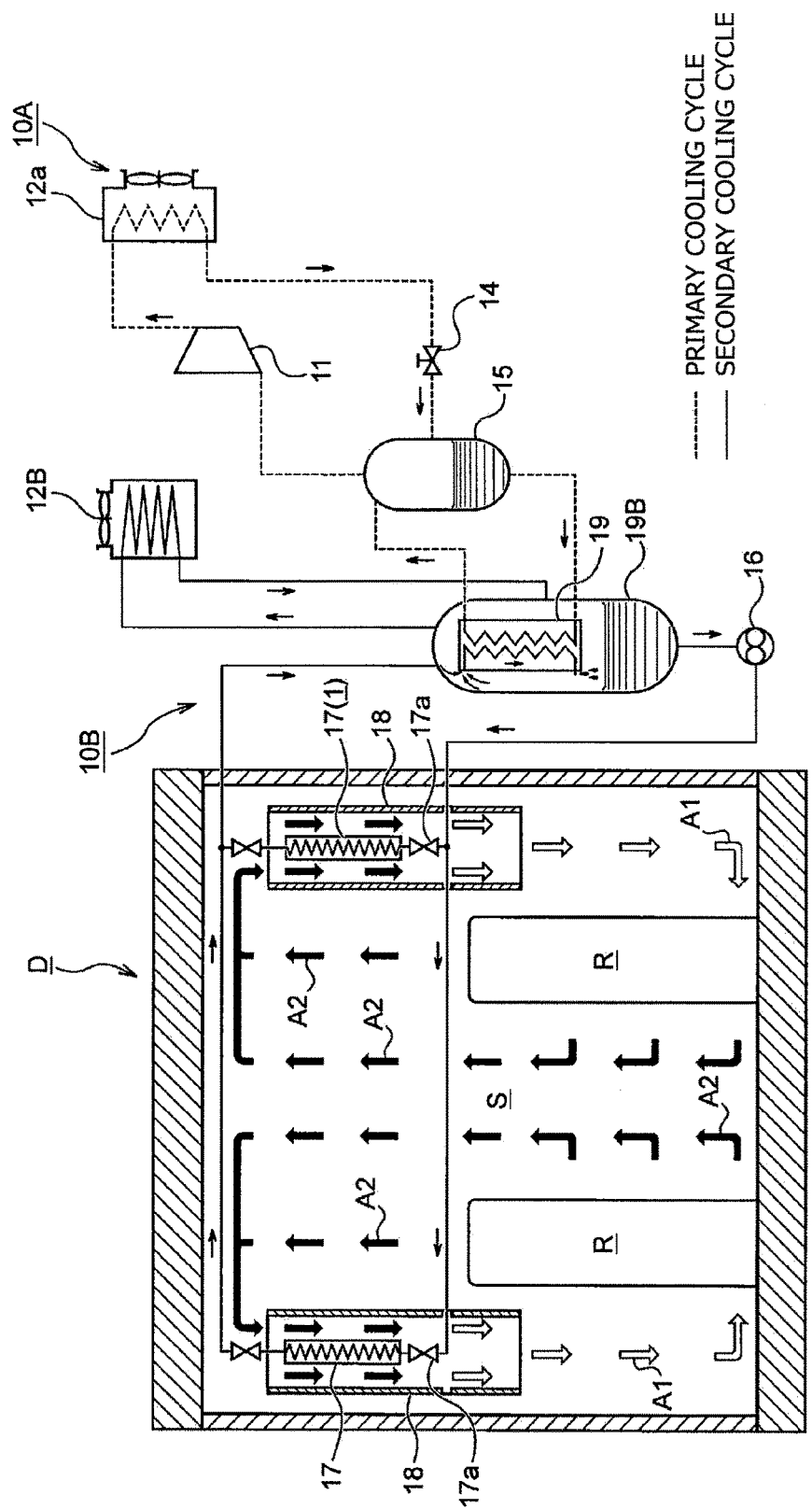
FIG. 7 is a schematic diagram illustrating a cooling mechanism in which: the refrigerant in the secondary cooling cycle can be condensed by the evaporative condenser; and the evaporative condenser is built in a liquid receiver in the secondary cooling cycle.

Furthermore, a configuration in which the cascade condenser 19 is built in the liquid receiver 19B in the apparatus configuration illustrated in FIG. 6 can also be adopted as illustrated in FIG. 7.

Then, in the case of adopting such a configuration, the secondary refrigerant in the liquid receiver 19B can be condensed by any one or both of the primary cooling cycle 10A (cascade condenser 19) and the evaporative condenser 12B, similarly to the apparatus configuration illustrated in FIG. 6. In addition, the following effects can be obtained.

That is, in the case where carbon dioxide is used as the secondary refrigerant, even if the pressure resistance of a plate cooler that is a constituent element of the cascade condenser 19 is low, the secondary refrigerant is condensed by the cascade condenser 19 built in the hermetically sealed liquid receiver 19B. Hence, the apparent pressure difference is small, and the secondary refrigerant can be safely and stably condensed.

Note that, although the evaporative condenser 12 or the condenser 12a is adopted as a condenser in the above-mentioned four types of other embodiments, every condenser can be the evaporative condenser 12, or can be other condensers than the evaporative condenser 12, such as a shell-and-tube condenser that uses water cooled by a cooling tower and an air-cooled condenser. In this case, the condensation temperature is higher even under the same outdoor air temperature condition, and hence the period during which the indoor space S of the data center D can be cooled to a proper temperature without using the compressor 11 is shorter than that in the case of adopting the evaporative condenser 12. However, the cooling mechanism 1 using these condensers may be advantageous in the case of cold areas such as Hokkaido.

Furthermore, although it is presupposed that the data center D is an application target of the cooling mechanism 1 of the present invention, the cooling mechanism 1 of the present invention may be applied to a printing factory, an automobile parts factory, and the like, which are facilities in which: a necessary cooling temperature is relatively high and the latent heat load is low; and, meanwhile, the sensible heat load is high and the generation source thereof covers a wide range, similarly to the data center D.

REFERENCE SIGNS LIST

1 cooling mechanism
10 heat pump unit
10A primary cooling cycle
10B secondary cooling cycle
10C first cooling cycle
10D second cooling cycle
11 compressor
12 evaporative condenser
12a condenser
13 high-pressure liquid receiver
14 liquid level controlling mechanism
15 low-pressure liquid receiver
16 liquid pump
17 evaporator
17a flow rate adjusting valve
17b expansion valve
18 partition wall
18a extension/contraction part
19 cascade condenser
19A liquid receiver
19B liquid receiver
152 bypass pipe line
A1 cool air
A2 warm air
D data center
R heat radiating machine
S indoor space
V1 valve
V2 valve
V3 valve
V4 valve
V5 blowoff valve

The invention claimed is:

1. A cooling mechanism for a data center, the cooling mechanism comprising:
a primary cooling cycle including, outside of the data center, a reciprocating compressor, a first evaporative condenser, a high-pressure liquid receiver, a liquid level controlling mechanism, a low-pressure liquid receiver, and a cascade condenser, and the primary cooling cycle further including a bypass pipe line for bypassing the reciprocating compressor; and
a secondary cooling cycle formed as a loop circuit, the secondary cooling cycle including (i) an evaporator arranged in an indoor space of the data center, the evaporator being connected to a liquid receiver and a liquid pump by pipe lines in the loop circuit, (ii) a second evaporative condenser directly connected via a refrigerant conduit to the liquid receiver in the secondary cooling cycle in parallel to the cascade condenser, and (iii) carbon dioxide as a secondary refrigerant condensed by the cascade condenser downstream of the evaporator, the cascade condenser being directly connected to the liquid receiver in the secondary cooling cycle, wherein:

the evaporator is configured to evaporate the secondary refrigerant so as to cool the indoor space, the first evaporative condenser is configured to condense a primary refrigerant, and the primary cooling cycle is configured to stop the compressor and open the bypass pipe line for bypassing the compressor in response to a condensation temperature of the first evaporative condenser being equal to or lower than a predetermined temperature so as to circulate the primary refrigerant without operating the compressor and cool the indoor space with the secondary refrigerant, the second refrigerant having been condensed by the cascade condenser in the secondary cooling cycle.

2. The cooling mechanism for the data center according to claim 1, wherein the cascade condenser is disposed within the liquid receiver in the secondary cooling cycle.

3. The cooling mechanism for the data center according to claim 1, wherein the second cooling cycle includes at least one blowoff valve configured to blow off the secondary refrigerant in the indoor space.

4. The cooling mechanism for the data center according to claim 1, wherein the evaporator is surrounded by an upright partition wall configured to produce an inverse stack effect, and when air in the vicinity of the evaporator is cooled, high-temperature air existing in an upper part of the indoor space of the data center is drawn toward the evaporator without using a fan, the high-temperature air is cooled, and then the cooled air is discharged downward.

5. The cooling mechanism for the data center according to claim 4, wherein a lower part of the partition wall is provided with an extension/contraction part.

* * * * *